(12) United States Patent
Kobayashi et al.

(10) Patent No.: US 10,684,550 B2
(45) Date of Patent: Jun. 16, 2020

(54) EXPOSURE APPARATUS, ADJUSTING METHOD, AND ARTICLE MANUFACTURING METHOD

(71) Applicant: CANON KABUSHIKI KAISHA, Tokyo (JP)

(72) Inventors: Daisuke Kobayashi, Utsunomiya (JP); Yuji Nakamura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/113,227

(22) Filed: Aug. 27, 2018

(65) Prior Publication Data

US 2019/0064504 A1 Feb. 28, 2019

(30) Foreign Application Priority Data

Aug. 31, 2017 (JP) ................. 2017-167658

(51) Int. Cl.
| G03F 7/20 | (2006.01) |
| G02B 26/02 | (2006.01) |
| G02B 19/00 | (2006.01) |
| G02B 5/00 | (2006.01) |

(52) U.S. Cl.
CPC ..... *G03F 7/70141* (2013.01); *G02B 19/0047* (2013.01); *G02B 19/0076* (2013.01); *G02B 19/0085* (2013.01); *G02B 26/02* (2013.01); *G03F 7/70108* (2013.01); *G03F 7/70158* (2013.01); *G03F 7/70191* (2013.01); *G02B 5/005* (2013.01); *G02B 26/023* (2013.01)

(58) Field of Classification Search
CPC ............ G02B 19/0047; G02B 19/0076; G02B 19/0085; G02B 26/02; G02B 26/023; G02B 5/005; G03F 7/70108; G03F 7/70141; G03F 7/70158; G03F 7/70191
See application file for complete search history.

(56) References Cited

U.S. PATENT DOCUMENTS 7,397,535 B2   7/2008 Mulder

FOREIGN PATENT DOCUMENTS

| JP | H11145033 A | 5/1999 |
| JP | 2007194600 A | 8/2007 |

*Primary Examiner* — Michelle M Iacoletti
(74) *Attorney, Agent, or Firm* — Rossi, Kimms & McDowell LLP

(57) ABSTRACT

An exposure apparatus is provided. An illumination optical system in the apparatus includes a diffraction optical element, a condensing optical system a detector that detects a light beam that exited from the condensing optical system, and a first diaphragm that can be inserted/removed in/from a position near a predetermined plane in an optical path where the condensing optical system condenses a light beam. The first diaphragm has an opening diameter such that an output of the detector decreases when an incident angle of light from a light source on the diffraction optical element deviates from a target angle. Based on an output of the detector when the first diaphragm is inserted in the position and an output of the detector when the first diaphragm is retracted from the position, a controller performs a process of adjusting the incident angle.

11 Claims, 5 Drawing Sheets

F I G. 5A
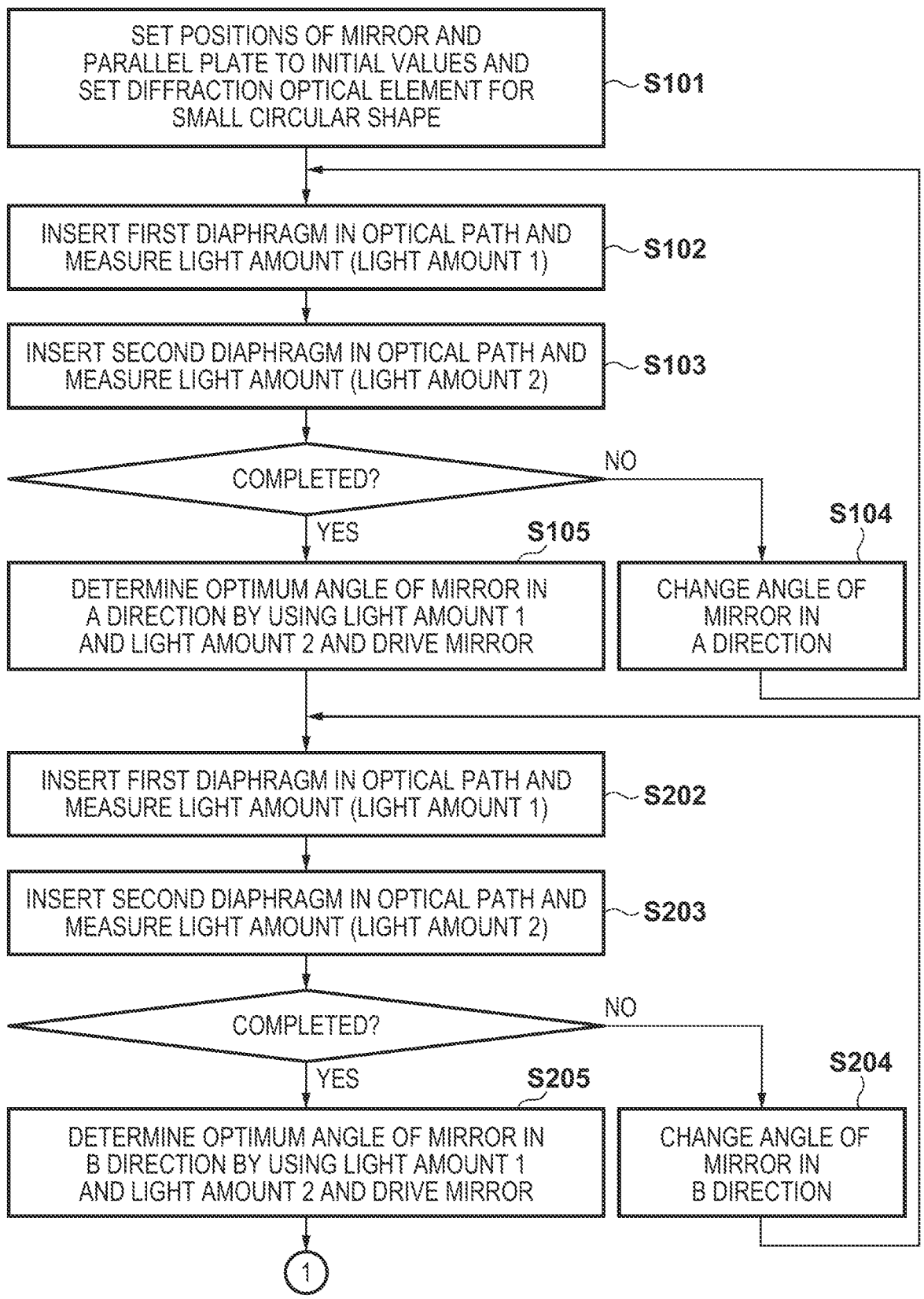

EXPOSURE APPARATUS, ADJUSTING METHOD, AND ARTICLE MANUFACTURING METHOD

BACKGROUND OF THE INVENTION

Field of the Invention

The present invention relates to an exposure apparatus, an adjusting method, and an article manufacturing method.

Description of the Related Art

Increases in resolution and throughput are increasingly required of a projection exposure apparatus that illuminates an original (a reticle or a mask) by an illumination optical apparatus and exposes a pattern of the original to a substrate via a projection optical system. In order to achieve a high resolution, a shorter wavelength of exposure light and an increase in numerical aperture (NA) (also referred to as a "higher NA") of the projection optical system are effective.

On the other hand, illuminating the original by modified illumination (annular illumination, dipole illumination, quadrupole illumination, or the like) is effective for increasing the resolution of the exposure apparatus. Then, it is conventionally known that a diffraction optical element is used for an illumination optical system to form the modified illumination.

If the angle of a light ray entering the diffraction optical element shifts in such an illumination system, the barycenter and symmetry of an effective light source may become worse, and telecentricity and overlay performance at the time of exposure may be deteriorated. If a light source unit is changed from a relatively small ultra-high pressure mercury lamp to a large excimer laser in order to shorten the wavelength of the exposure light, it becomes impossible to mount the light source unit in an exposure apparatus main body, resulting in, for example, arranging the exposure apparatus main body on the second floor and arranging the optical source unit on the first floor. In this case, the relative positions of the exposure apparatus main body and the light source unit may change due to a vibration, and a positional shift and an angular shift may occur between the optical axis (central ray) of illumination light and the optical axis of the illumination optical apparatus. It is therefore necessary to correct the positional shift and the angular shift. In a conventional exposure apparatus, as a method of correcting a positional shift and an angular shift, exposure light is branched to guide it to a monitor optical system, and an optical axis is detected by a dedicated monitor (see Japanese Patent Laid-Open Nos. 11-145033 and 2007-194600).

In the conventional method, however, in order to detect an optical axis shift, it is necessary to branch an optical path to guide it to a monitoring optical system different from that for the exposure light, and to detect the optical axis by the dedicated monitor. Such a dedicated monitor and a monitoring optical system result in a bulky apparatus.

SUMMARY OF THE INVENTION

The present invention provides, for example, an exposure apparatus capable of adjusting an illumination optical system while suppressing an increase in apparatus size.

The present invention in its one aspect provides an exposure apparatus comprising an illumination optical system configured to illuminate an original with light from a light source, a projection optical system configured to project a pattern of the original on a substrate, and a controller, wherein the illumination optical system includes a diffraction optical element provided in an optical path between the light source and the original, a condensing optical system configured to condense a light beam that exited from the diffraction optical element, a detector configured to detect a light beam that exited from the condensing optical system, and a first diaphragm that can be inserted/removed in/from the optical path near a predetermined plane where the light beam is condensed by the condensing optical system, an opening diameter of the first diaphragm is set such that an output of the detector decreases when an incident angle of the light from the light source on the diffraction optical element deviates from a target angle, and based on a first output as an output of the detector when the first diaphragm is inserted in the optical path near the predetermined plane and a second output as an output of the detector when the first diaphragm is retracted from the optical path near the predetermined plane, the controller performs a process of adjusting the incident angle.

Further features of the present invention will become apparent from the following description of exemplary embodiments (with reference to the attached drawings).

BRIEF DESCRIPTION OF THE DRAWINGS

FIGS. 5A-B are flowcharts showing a method of adjusting angles and positions at which light rays enter the diffraction optical element.

DESCRIPTION OF THE EMBODIMENTS

Various exemplary embodiments, features, and aspects of the invention will be described in detail below with reference to the drawings.

The embodiments of the present invention will be described in detail below with reference to the accompanying drawings. Note that the following embodiments are merely specific examples of embodiments of the present invention, and do not limit the present invention. In addition, not all combinations of characteristic features described in the following embodiments are essential to the solution of the problem in the present invention.

Figure 1:
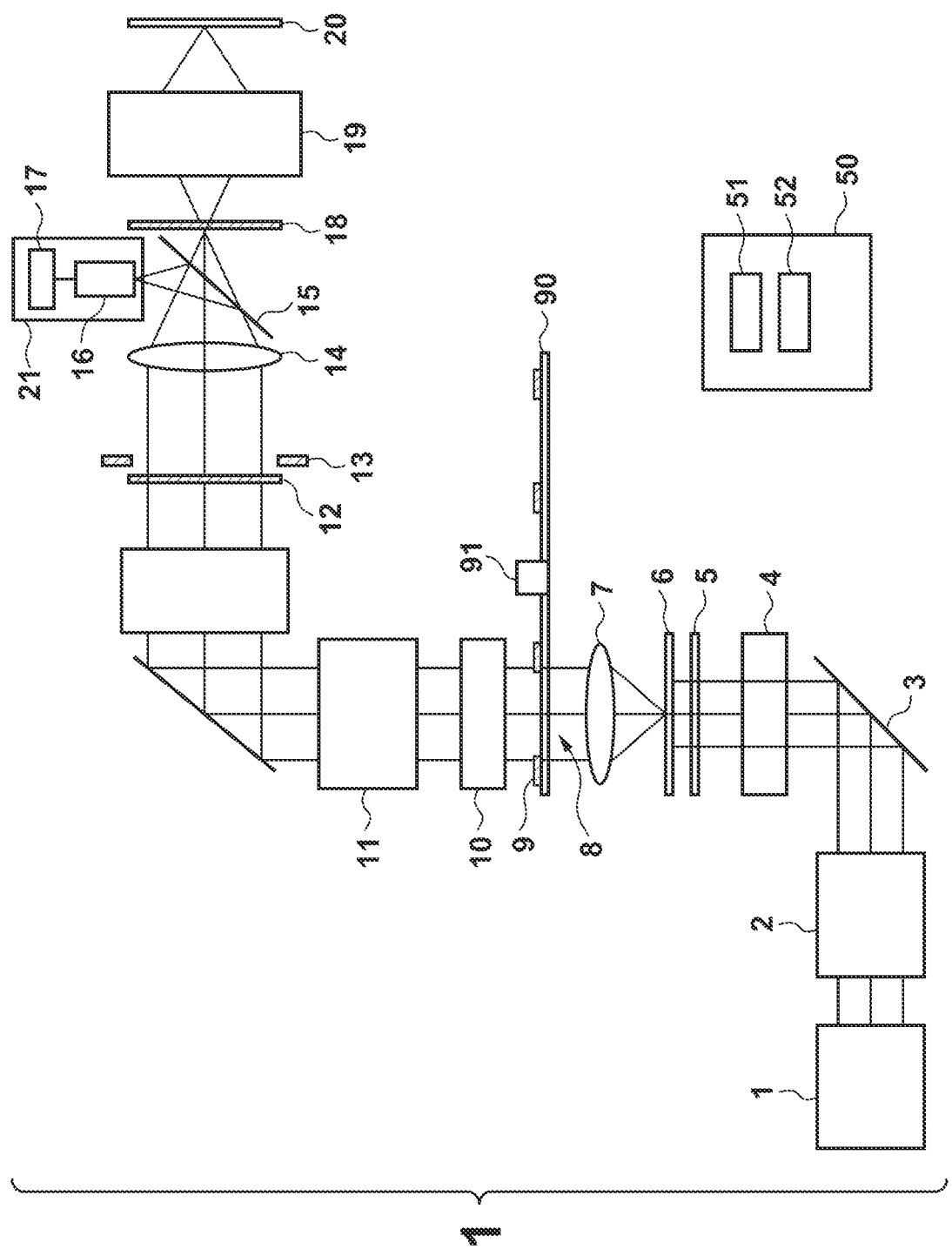
FIG. 1 is a view showing the arrangement of an exposure apparatus according to an embodiment.

FIG. 1 is a view showing the arrangement of an exposure apparatus according to an embodiment. The exposure apparatus includes an illumination optical system that illuminates an original (a mask or a reticle) 18 by a light beam from a light source 1 and a projection optical system 19 that projects a pattern of the original 18 on a substrate (a wafer or a liquid crystal substrate) 20. The exposure apparatus of this embodiment may be a step-and-scan type exposure apparatus or a step-and-repeat type exposure apparatus.

The light source 1 can include an excimer laser or a mercury lamp that generates light (light beam). The illumination optical system includes a relay optical system 2, a mirror 3, a parallel plate 4, an optical integrator 5, a diffraction optical element 6, a condenser lens 7, diaphragms 9, and a prism unit 10. The illumination optical system also includes a zoom lens unit 11, a multiple beam forming unit 12, a diaphragm 13, and a condenser lens 14.

The relay optical system 2 is provided between the light source 1 and the optical integrator 5, and guides the light beam from the light source 1 to the optical integrator 5. The optical integrator 5 that illuminates the diffraction optical element 6 is provided on a light source side of the diffraction optical element 6 and guides the light beam from the light source 1 to the diffraction optical element 6 while keeping the divergent angle of the light beam constant. The optical integrator 5 can be formed by a fly-eye lens, a microlens array, or the like.

The diffraction optical element 6 is arranged on a plane conjugate to the original 18 serving as a plane to be illuminated or a plane having a Fourier transform relationship with a pupil plane of the illumination optical system. The diffraction optical element 6 converts a light intensity distribution of the light beam from the light source 1 by a diffraction effect to form a desired light intensity distribution on the pupil plane of the illumination optical system conjugate to the pupil plane of the projection optical system 19 or a plane conjugate to the pupil plane of the illumination optical system. The diffraction optical element 6 may use a Computer Generated Hologram designed by a computer so as to obtain a desired diffraction pattern on a diffraction pattern plane. A light source shape formed on the pupil plane of the projection optical system 19 will be referred to as an effective light source shape. The diffraction optical element 6 is provided between the optical integrator 5 and the condenser lens 7. The light beam from the optical integrator 5 irradiates the diffraction optical element 6, is diffracted by the diffraction optical element 6, and is guided to the condenser lens 7.

The diffraction optical element 6 can be a diffraction optical element selected from a plurality of diffraction optical elements that form different effective light source shapes. For example, each of the plurality of diffraction optical elements is mounted on a corresponding slot out of a plurality of slots of a turret (not shown). A plurality of effective light source shapes can include a small circular shape (relatively small circular shape), a large circular shape (relatively large circular shape), an annular shape, a dipole, a quadrupole, and another shape. An illumination method by the effective light source shapes of the annular shape, the dipole, and the quadrupole will be referred to as modified illumination.

The condenser lens 7 provided between the diffraction optical element 6 and the prism unit 10 is a condensing optical system that condenses the light beam that exited from the diffraction optical element 6. The condenser lens 7 condenses the light beam diffracted by the diffraction optical element 6 and forms a diffraction pattern on a Fourier transform plane 8. The Fourier transform plane 8 is a plane between the multiple beam forming unit 12 (optical integrator) and the diffraction optical element 6, and optically has a Fourier transform relationship with the diffraction optical element 6. If the diffraction optical element 6 located in the optical path is exchanged, it is possible to change the shape of the diffraction pattern formed on the Fourier transform plane 8.

The diaphragms 9 are arranged on a predetermined plane (Fourier transform plane 8) where the condenser lens 7 (condensing optical system) condenses the light beam or at a position near the predetermined plane in the optical path. Each diaphragm 9 can be formed by, for example, a blade, a filter, or the like. The diaphragms 9 are arranged to be inserted/removed in/from the position near the predetermined plane (Fourier transform plane 8) where the condenser lens 7 (condensing optical system) condenses the light beam in the optical path. In this embodiment, this insertable/removable arrangement is implemented by a turret 90 where a plurality of different diaphragms are formed. The first diaphragm having a small opening diameter (the details of which are to be described later) and the second diaphragm having a large opening diameter are mounted on corresponding slots out of a plurality of slots in the turret 90. The turret 90 may additionally mount a diaphragm for modified illumination. The turret 90 serving as a selection unit is driven by control by a controller 50 and selects a diaphragm corresponding to the diffraction optical element 6 out of the plurality of diaphragms to arrange it in the optical path. The turret 90 is rotatably driven by an actuator 91, arranging the diaphragm selected from the plurality of diaphragms in the optical path.

Figure 2:
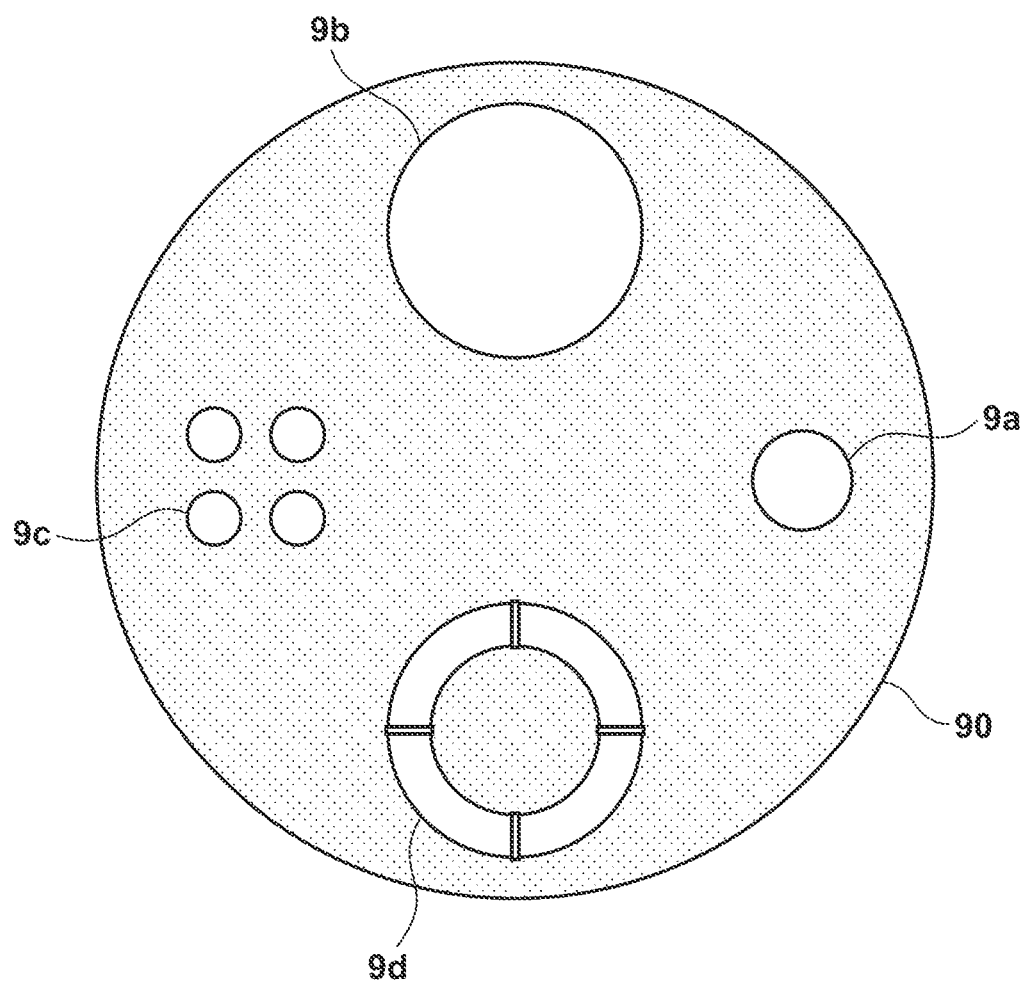
FIG. 2 is a view showing the details of diaphragms.

FIG. 2 shows an example of the turret 90. The turret 90 includes a first diaphragm 9a compatible with small circular illumination, and a second diaphragm 9b compatible with large circular illumination and having a larger opening diameter than the first diaphragm 9a. The turret 90 can also include a quadrupole diaphragm 9c for quadrupole illumination and a ring shape diaphragm 9d for annular illumination. A diaphragm needed when changing the shape of an incident light source of illumination light is selected and inserted in the optical path. In particular, the first diaphragm 9a and the second diaphragm 9b are used in a process of adjusting the position and angle of a light beam entering the optical integrator 5 to be described later (that is, the light beam entering the diffraction optical element 6).

Referring back to FIG. 1, the prism unit 10 and the zoom lens unit 11 are provided between the diaphragms 9 and the multiple beam forming unit 12 (optical integrator), and function as a zoom optical system that enlarges the light intensity distribution formed on the Fourier transform plane 8. The prism unit 10 can guide the diffraction pattern (light intensity distribution) formed on the Fourier transform plane 8 to the zoom lens unit 11 by adjusting the annular ratio or the like.

The zoom lens unit 11 is provided between the prism unit 10 and the multiple beam forming unit 12. The zoom lens unit 11 can guide the diffraction pattern formed on the Fourier transform plane 8 to the multiple beam forming unit 12 by adjusting a σ value relative to the ratio of the NA of the illumination optical system and the NA of the projection optical system as a reference.

The multiple beam forming unit 12 is provided between the zoom lens unit 11 and the condenser lens 14, and in accordance with the annular ratio, an opening angle, and the diffraction pattern having the adjusted σ value, forms many two-dimensional light sources and guides them to the condenser lens 14. The multiple beam forming unit 12 can be the optical integrator formed by a fly-eye lens, an optical pipe, a diffraction optical element, a microlens array, or the like. The diaphragm 13 is provided between the multiple beam forming unit 12 and the condenser lens 14.

The condenser lens 14 is provided between the multiple beam forming unit 12 and the original 18. This makes it possible to illuminate the original 18 uniformly by condensing may light beams guided from the multiple beam forming unit 12 and illuminating the original 18 in a superimposed manner.

The illumination optical system further includes a detector 21 that detects the light beam that exited from the condenser lens 7. For example, a half mirror 15 is arranged between the condenser lens 14 and the original 18, and light reflected by the half mirror 15 is guided to the detector 21. The detector 21 can include a measurement optical system 16 and a sensor 17. The light from the half mirror 15 enters the measurement optical system 16, and the light that exited from the measurement optical system 16 enters the sensor 17. The controller 50 can measure a light amount based on the output of the detector 21.

The controller 50 comprehensively controls respective units of the exposure apparatus. The controller 50 can control an exposure amount at the time of exposure appropriately based on, for example, the light amount measured by using the detector 21. The controller 50 can be formed by a computer that includes, for example, a CPU 51 and a memory 52.

The original 18 is arranged at a position between the condenser lens 14 and the projection optical system 19, and has a pattern (for example, a circuit pattern) transferred to a substrate 20. The original 18 is supported and driven by an original stage (not shown). The projection optical system 19 projects an image of the pattern of the original 18 on the substrate 20. The projection optical system 19 is provided between the original 18 and the substrate 20, and maintains them in an optically conjugate relationship. The substrate 20 is supported and driven by a substrate stage (not shown).

At the time of exposure, the illumination optical system illuminates the original 18, and the projection optical system 19 projects the pattern of the original 18 on the substrate 20. The shape of an effective light source influences the resolution of the pattern of the original 18 projected on the substrate 20. It is therefore possible to improve the resolution of the pattern by forming an appropriate effective light source distribution.

In this embodiment, the illumination optical system further includes, between the relay optical system 2 and the optical integrator 5 (diffraction optical element 6), the mirror 3 that bends light from the light source 1 and guides it to the optical integrator 5. The illumination optical system further includes the parallel plate 4 provided in the optical path between the mirror 3 and the optical integrator 5.

A rectangular parallel light beam supplied from the light source 1 enters the optical integrator 5 via the mirror 3 and the parallel plate 4. With the mirror 3 and the parallel plate 4, it is possible to adjust the position and angle of the light beam entering the optical integrator 5 (that is, the light beam entering the diffraction optical element 6).

Figure 3:
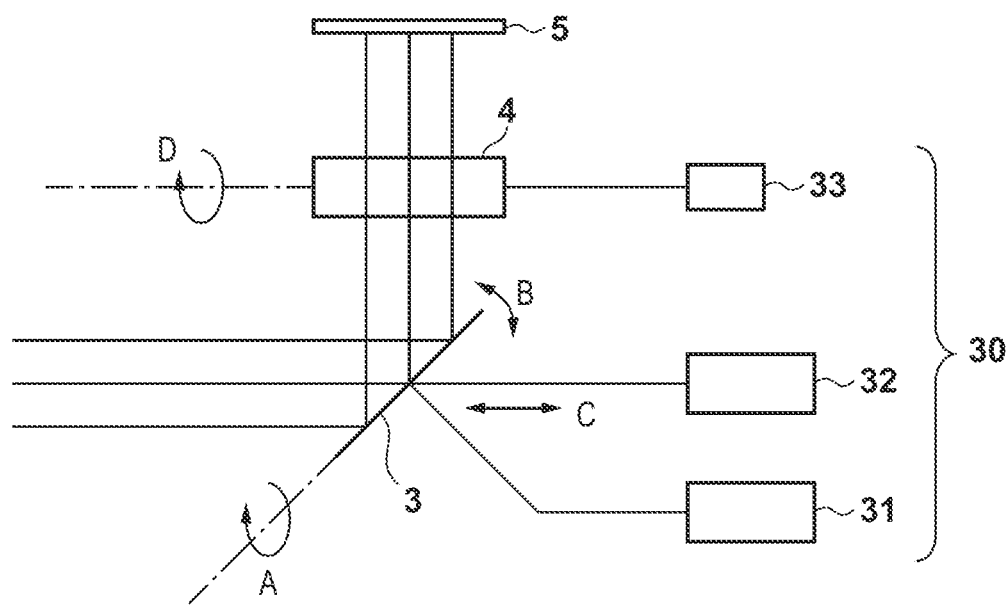
FIG. 3 is a view for explaining a mechanism that adjusts the angle and position of light entering a diffraction optical element.

The adjusting mechanism of the mirror 3 and parallel plate 4 will be described next with reference to FIG. 3. In this embodiment, the illumination optical system includes an adjusting unit 30 that adjusts the angle and position of the light entering the optical integrator 5 (that is, the diffraction optical element 6) by adjusting the mirror 3 and the parallel plate 4. The adjusting unit 30 can include an actuator 31, an actuator 32, and an actuator 33 to be described below. The actuator 31 (first adjusting mechanism) performs rotational driving of the mirror 3 about an axis extending in a direction along a paper surface of FIG. 3 (A direction shown in FIG. 3) and rotational driving about an axis extending in a direction perpendicular to the paper surface (B direction). The actuator 32 (second adjusting mechanism) adjusts the position of the mirror 3 in a direction (C direction) along the paper surface of FIG. 3. The actuator 33 (third adjusting mechanism) performs rotational driving of the parallel plate 4 about an axis along the paper surface of FIG. 3 (D direction). This makes it possible to adjust a tilting angle with respect to the optical axis of the parallel plate 4. When the parallel plate 4 is driven rotatably, the light beam entering the parallel plate 4 is that exited in a state in which it is translated with respect to the optical axis of incident light.

An adjusting method of the mirror 3 and parallel plate 4 will be described next. The optical integrator 5 has a function of making the angles of the light rays entering the diffraction optical element 6 uniform in an entire region of the diffraction optical element 6. However, if an angle at which the light beam enters the optical integrator 5 exceeds an allowable value, a deviation occurs in angle at which the light beam enters the diffraction optical element 6. If the angle of the light beam entering the diffraction optical element 6 deviates, a distribution formed on the Fourier transform plane 8 deviates from a desired distribution.

Figure 4:
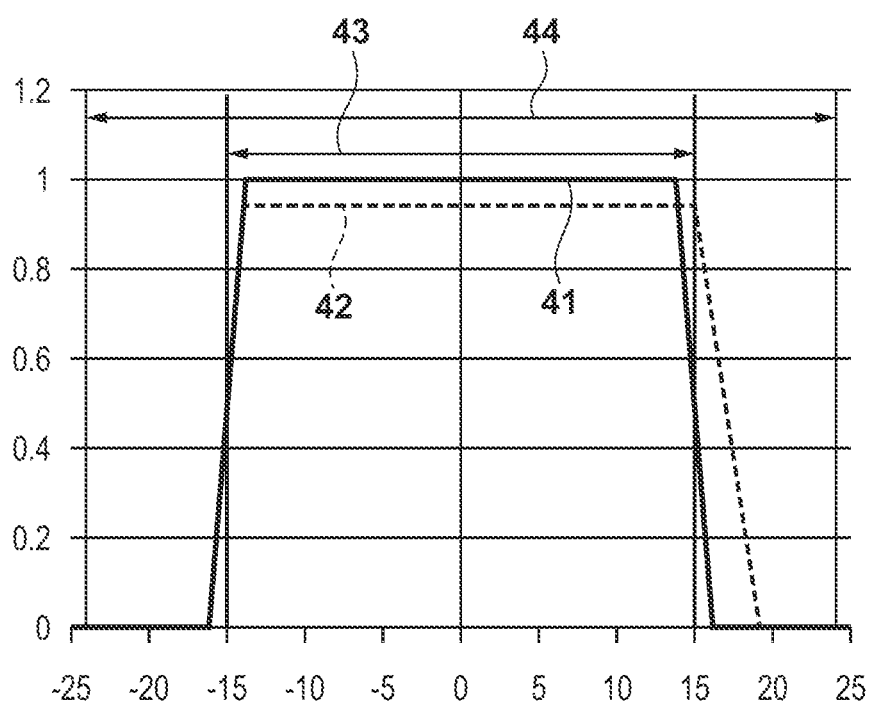
FIG. 4 is a graph showing an example of light amount distributions formed on a Fourier transform plane.

FIG. 4 shows an example of light amount distributions formed on the Fourier transform plane 8. In FIG. 4, a graph 41 represents a light amount distribution formed on the Fourier transform plane 8 in a case in which there is no deviation in angle at which light enters the optical integrator 5. A graph 42 represents a distribution formed on the Fourier transform plane 8 in a case in which there is a deviation in angle at which the light enters the optical integrator 5. If the distribution formed on the Fourier transform plane 8 deviates from the graph 41 as the graph 42, an effective light source distribution deviates from a desired distribution, worsening image performance. In addition, the angle or position of the light entering the optical integrator 5 deviates, vignetting occurs in an optical system after the optical integrator 5, decreasing illuminance. It is therefore necessary to adjust the deviations in angle and position of the light entering the optical integrator 5.

In this embodiment, the controller 50 controls the adjusting unit 30 to adjust the deviations in angle and position of the light entering the optical integrator 5 by using the first diaphragm 9a having the small opening diameter and the second diaphragm 9b having the large opening diameter. For this adjustment, for example, the light amount ratio is used, which is obtained as the ratio of the first output as an output of the detector 21 when the first diaphragm 9a is inserted to the second output as an output of the detector 21 when the first diaphragm 9a is retracted. In order to perform this adjustment, the way in which the opening diameter of the first diaphragm 9a is determined is important. The first diaphragm 9a has an opening diameter such that the output of the detector 21 decreases if an incident angle of light from the light source 1 on the optical integrator 5 (diffraction optical element 6) deviates from a target angle. If there is no deviation from the target angle, it is assumed that the output (light amount) of the detector 21 when the first diaphragm 9a is used is, for example, about 97% or higher relative to the output of the detector 21 when the first diaphragm 9a is not used (that is, when the second diaphragm 9b is used). Note that the target angle refers to an ideal angle without any deviation in incident angle. For example, the opening diameter of the first diaphragm 9a is the same as or slightly smaller than the width of the light amount distribution formed on the predetermined plane (Fourier transform plane 8). If the opening of the first diaphragm 9a is too large or too small relative to the size of the light amount distribution formed on the Fourier transform plane 8 by the diffraction optical element 6, a decrease in light amount ratio if the incident angle on the optical integrator 5 (diffraction optical element 6) deviates is small and difficult to detect. In the embodiment, it is possible to set the opening diameter of the first diaphragm 9a to, for example, a diameter where the first output as the output of the detector 21 when the first diaphragm 9a is inserted comes to be in a range of 80% to 100% of the second output as the output of the detector 21 when the first diaphragm 9a is retracted. Note that it is only necessary that the opening diameter of the second diaphragm 9b is larger than the first diaphragm 9a, for example, larger than the width of the effective light source distribution formed on the Fourier transform plane 8. Selecting the second diaphragm 9b by the turret 90 and inserting it in the optical path correspond to retracting the first diaphragm 9a from the optical path.

In FIG. 4, a width 43 represents an opening diameter of the first diaphragm 9a, and a width 44 represents an opening diameter of the second diaphragm 9b. According to the first diaphragm 9a determined as described above, if the deviation does not occur in the incident angle, a light amount (a light amount inside the width 43) when the first diaphragm 9a is used does not decrease relative to a light amount (a light amount inside the width 44) when the second diaphragm 9b is used (that is, when the first diaphragm 9a is retracted). On the other hand, if the deviation occurs in the incident angle, the light amount (the light amount inside the width 43) when the first diaphragm 9a is used decreases relative to the light amount (the light amount inside the width 44) when the second diaphragm 9b is used (that is, when the first diaphragm 9a is retracted). Therefore, in this embodiment, a process of adjusting the incident angle so as to prevent such a decrease in light amount (decrease in light amount ratio) is performed.

Note that instead of an arrangement that makes selection from the plurality of diaphragms having different diameters of openings by using the turret 90, an iris diaphragm having a variable opening diameter may be used. By changing the opening diameter of the iris diaphragm, it is possible to implement an operation equivalent to insertion/removal of the first diaphragm 9a and second diaphragm 9b. Instead of including the first diaphragm 9a and the second diaphragm 9b dedicated to adjustment, the diaphragms for modified illumination used at the time of exposure may be used as the first diaphragm 9a and the second diaphragm 9b as long as the above-described condition of an opening width is met.

Figure 5B:
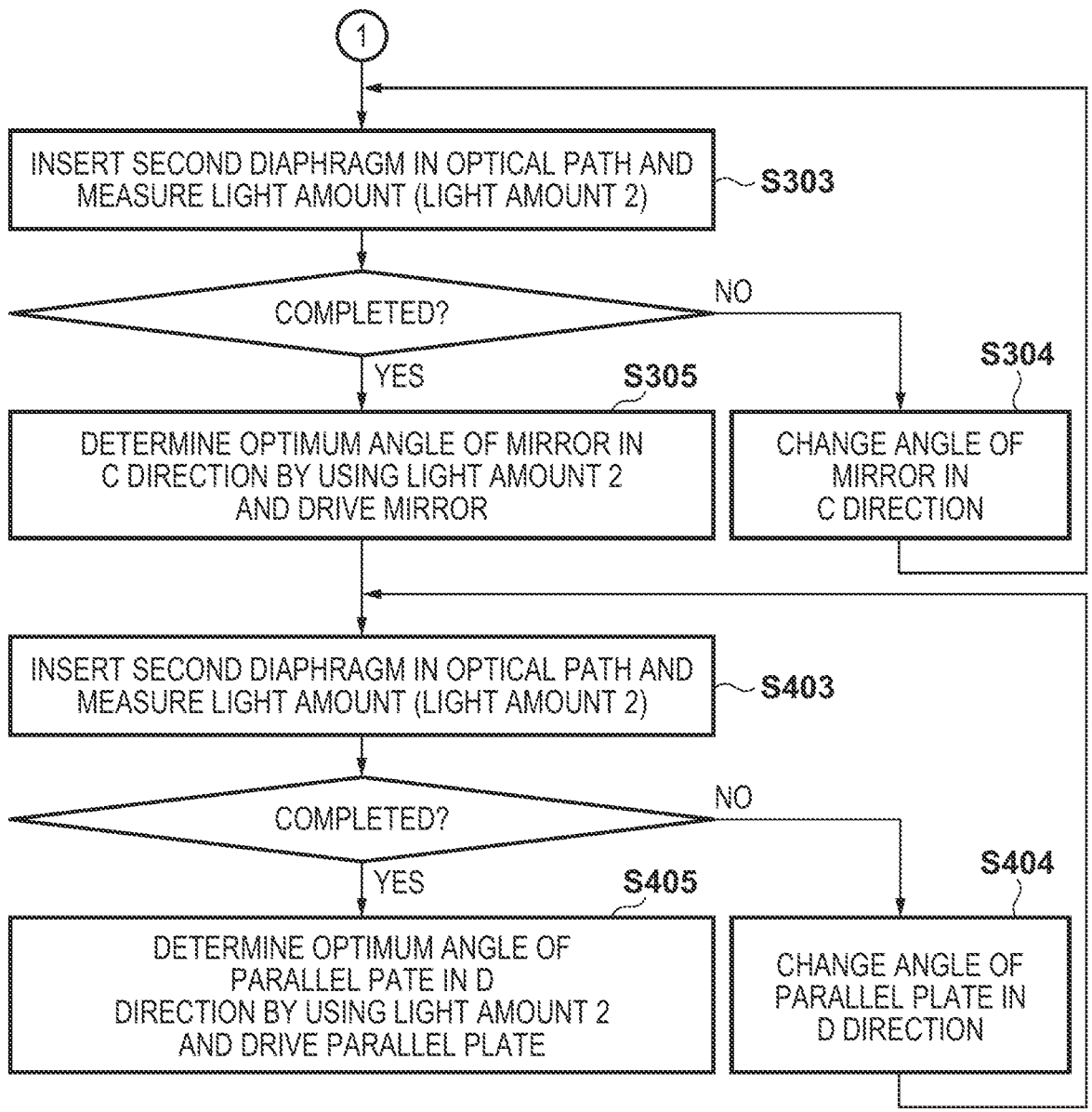

FIGS. 5A-B are flowcharts showing an adjusting method of adjusting an angle and position at which the light beam enters the optical integrator 5 (that is, the diffraction optical element 6). In step S101, the controller 50 sets the positions of the mirror 3 and parallel plate 4 to initial values, and selects a diffraction optical element for a small circular shape out of the plurality of diffraction optical elements in the optical path. In step S102 (first step), the controller 50 controls the turret 90 to select the first diaphragm 9a out of the plurality of diaphragms and arrange it in the optical path. In a state in which the first diaphragm 9a is arranged in the optical path, the controller 50 measures a light amount from an output of the detector 21 and stores this light amount as light amount 1 in a memory 52.

Next, in step S103 (second step), the controller 50 controls the turret 90 to select the second diaphragm 9b having the larger opening diameter than the first diaphragm 9a out of the plurality of diaphragms 9 and arrange it in the optical path. This corresponds to an operation of retracting the first diaphragm 9a from the optical path. In a state in which the second diaphragm 9b is arranged in the optical path replacing the first diaphragm 9a, the controller 50 measures a light amount from an output of the detector 21 and stores this light amount as light amount 2 in the memory 52.

Next, the controller 50 changes the angle of the mirror 3 in the A direction in step S104, and returns to steps S102 and S103 to measure light amount 1 and light amount 2. In this manner, the controller 50 sequentially changes the angle of the mirror 3 in the A direction within a predetermined range, and measures light amount 1 and light amount 2 repeatedly at each of the changed incident angles. After completing measurement at all the angles within the predetermined range, the controller 50 determines an optimum angle of the mirror 3 in the A direction by using measured light amount 1 and light amount 2 in step S105. For example, the controller 50 calculates the light amount ratio as the ratio of light amount 1 to light amount 2 at each angle. Then, based on these calculated light amount ratios, the controller 50 determines an angle (optimum angle) of the mirror 3 in the A direction to be adjusted. For example, the controller 50 determines an angle at which the light amount ratio is maximized as the optimum angle of the mirror 3 in the A direction. Alternatively, the controller 50 can determine, as the optimum angle of the mirror 3 in the A direction, an angle at the midpoint of two angles where, for example, a 0.98-time light amount relative to light amount 1 at the angle at which the light amount ratio is maximized is obtained. With this process, the controller 50 can, for example, notify a user of the determined angle as a process for adjusting an incident angle. The notification can be made by displaying the determined angle on, for example, a display (not shown). The controller 50 may control the angle of the mirror 3 in the A direction to the determined angle as an automatic adjusting function for the incident angle.

Note that it is impossible to optimize the angle of the light beam entering the optical integrator 5 by using only light amount 1. This is because the position of the light beam entering the optical integrator 5 also shifts if the mirror 3 is rotatably driven in the A direction, decreasing the light amount while being eclipsed by the optical integrator 5. It is necessary to obtain a value obtained by normalizing light amount 1 with light amount 2 in order to grasp a decrease in light amount by the first diaphragm 9a as distinguished from a decrease in light amount by the optical integrator 5. Therefore, not the value of light amount 1 but the light amount ratio of light amount 1 and light amount 2 is used.

Next, in step S202, the controller 50 controls the turret 90 to arrange the first diaphragm 9a in the optical path, measures the light amount in that state, and stores this as light amount 1 in the memory 52. Next, in step S203, the controller 50 controls the turret 90 to arrange the second diaphragm 9b in the optical path, measures the light amount in that state, and stores this as light amount 2 in the memory 52. The controller 50 changes the angle of the mirror 3 in the B direction in step S204, and returns to steps S202 and S203 to measure light amount 1 and light amount 2. In this manner, the controller 50 measures light amount 1 and light amount 2 repeatedly while sequentially changing the angle of the mirror 3 in the B direction within a predetermined range. After completing measurement at all the angles within the predetermined range, the controller 50 determines an optimum angle of the mirror 3 in the B direction by using measured light amount 1 and light amount 2 in step S205. For example, the controller 50 calculates the light amount ratio as the ratio of light amount 1 to light amount 2 at each angle. Then, based on these calculated light amount ratios, the controller 50 determines the optimum angle of the mirror 3 in the B direction. For example, the controller 50 determines an angle at which the light amount ratio is maximized as the optimum angle of the mirror 3 in the B direction. Alternatively, the controller 50 can determine, as the optimum angle of the mirror 3 in the B direction, an angle at the midpoint of two angles where, for example, the 0.98-time light amount relative to light amount 1 at the angle at which the light amount ratio is maximized is obtained. This allows the controller 50 to, for example, notify the user of the determined angle as a process for adjusting an incident angle. The notification can be made by displaying the determined angle on, for example, the display (not shown). The controller 50 may control the angle of the mirror 3 in the B direction to the determined angle as an automatic adjusting function for the incident angle.

In steps S101 to S205 above, the position of the mirror 3 in the C direction and the angle of the parallel plate 4 in the D direction are fixed. However, in order to prevent the measurement accuracy of light amount 1 and light amount 2 from decreasing due to a large shift in position at which the light beam enters the optical integrator 5, steps S101 to S205 may be performed after adjusting the C and D directions so that the shift in position at which the light beam enters the optical integrator 5 is minimized.

Next, the position of the mirror 3 in the C direction and the angle of the parallel plate 4 in the D direction are adjusted in the above-described manner. However, even if the position of the mirror 3 in the C direction or the angle of the parallel plate 4 in the D direction is changed, the angle of the light beam entering the optical integrator 5 does not deviate. Thus, the light amount ratio need not be seen, and it is only necessary to see just light amount 2 obtained by using the second diaphragm 9b. Alternatively, it is only necessary to see just light amount 1 obtained by using the first diaphragm 9a. Only light amount 2 obtained by using the second diaphragm 9b will be seen below. A step of adjusting the position of the mirror 3 in the C direction and the angle of the parallel plate 4 in the D direction will be described below.

In step S303, the controller 50 controls the turret 90 to arrange the second diaphragm 9b in the optical path, measures the light amount in that state, and stores this as light amount 2 in the memory 52. The controller 50 moves the position of the mirror 3 in the C direction in step S304 and returns to step S303 to measure light amount 2. In this manner, the controller 50 measures light amount 2 repeatedly while sequentially changing the position of the mirror 3 in the C direction within a predetermined range. After completing measurement at all the positions within the predetermined range, the controller 50 determines an optimum position of the mirror 3 in the C direction by using light amount 2 in step S305. For example, the controller 50 determines a position at which light amount 2 is maximized as the optimum position of the mirror 3 in the C direction. Alternatively, the controller 50 can determine, as the optimum position of the mirror 3 in the C direction, a position at the midpoint of two positions where, for example, a 0.98-time light amount relative to the light amount at the position at which light amount 2 is maximized is obtained. The controller 50 controls, for example, the position of the mirror 3 in the C direction to the thus determined position.

Next, in step S403, the controller 50 controls the turret 90 to arrange the second diaphragm 9b in the optical path, measures the light amount in that state, and stores this as light amount 2 in the memory 52. The controller 50 changes the angle of the parallel plate 4 in the D direction in step S404 and returns to step S403 to measure light amount 2. In this manner, the controller 50 measures light amount 2 repeatedly while sequentially changing the angle of the parallel plate 4 in the D direction within a predetermined range. After completing measurement at all the angles within the predetermined range, the controller 50 determines an optimum angle of the parallel plate 4 in the D direction by using light amount 2 in step S405. For example, the controller 50 determines an angle at which light amount 2 is maximized as the optimum angle of the parallel plate 4 in the D direction. Alternatively, the controller 50 determines, as the optimum angle of the parallel plate 4 in the D direction, an angle at the midpoint of two angles where, for example, a 0.98-time light amount relative to the light amount at the angle at which light amount 2 is maximized is obtained. The controller 50 controls, for example, the angle of the parallel plate 4 in the D direction to the thus determined angle.

In this embodiment, it is possible to determine the angles of the mirror 3 in the A and B directions, and the position of the mirror 3 in the C direction, and the angle of the parallel plate 4 in the D direction as described above. It is further possible to adjust the mirror 3 and the parallel plate 4 at the determined angles and position, respectively. This makes it possible to adjust the position and angle of light entering the optical integrator 5. According to such an embodiment, it is unnecessary to install the monitor dedicated to adjustment and the monitor optical system that are needed conventionally, making it possible to adjust the illumination optical system while suppressing an increase in apparatus size.

Adjustment of the position of the mirror 3 in the C direction and the angle of the parallel plate 4 in the D direction may be optional. For example, if the light amount ratio exceeding a predetermined threshold is obtained only by adjusting the angles of the mirror 3 in the A and B directions, the position of the mirror 3 in the C direction and the angle of the parallel plate 4 in the D direction may not be adjusted.

<Embodiment of Article Manufacturing Method>

An article manufacturing method according to an embodiment of the present invention is suitable for manufacturing an article, for example, a microdevice such as a semiconductor device or an element having a microstructure. The article manufacturing method according to this embodiment includes a step of forming, using the above-described exposure apparatus, a latent image pattern on a photoresist applied to a substrate (a step of exposing a substrate), and a step of developing the substrate with the latent image pattern formed in the above step. The manufacturing method also includes other known steps (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-167658, filed Aug. 31, 2017, which is hereby incorporated by reference herein in its entirety.

What is claimed is:

1. An exposure apparatus comprising:
an illumination optical system configured to illuminate an original with light from a light source;
a projection optical system configured to project a pattern of the original on a substrate; and
a controller,
wherein the illumination optical system includes
a diffraction optical element provided in an optical path between the light source and the original,
a condensing optical system configured to condense a light beam that exited from the diffraction optical element,
a detector configured to detect a light beam that exited from the condensing optical system, and
a first diaphragm configured to be inserted in the optical path near a predetermined plane where the light beam is condensed by the condensing optical system,
an opening diameter of the first diaphragm is set such that an output of the detector decreases when an incident angle of the light from the light source on the diffraction optical element deviates from a target angle, and
based on a first output as an output of the detector when the first diaphragm is inserted in the optical path near the predetermined plane and a second output as an output of the detector when the first diaphragm is retracted from the optical path near the predetermined plane, the controller performs a process of adjusting the incident angle.

2. The apparatus according to claim 1, wherein the opening diameter of the first diaphragm is set such that the first output comes to be in a rage of 80% to 100% relative to the second output.

3. The apparatus according to claim 1, further comprising an adjusting mechanism configured to adjust the incident angle,
wherein the controller sequentially changes the incident angle by the adjusting mechanism, repeatedly calculates a light amount ratio obtained as a ratio of the first output to the second output at each of the changed incident angles, and controls the adjusting mechanism so as to set the incident angle to an angle at which the light amount ratio is maximized.

4. The apparatus according to claim 3, wherein the illumination optical system further includes a mirror configured to bend the light from the light source and guide the light to the diffraction optical element,
the adjusting mechanism includes a first adjusting mechanism configured to adjust an angle of the mirror, and
the first adjusting mechanism adjusts the angle of the mirror so as to set the incident angle to the angle at which the light amount ratio is maximized.

5. The apparatus according to claim 4, wherein the adjusting mechanism further includes a second adjusting mechanism configured to adjust a position of the mirror, and
the second adjusting mechanism adjusts the position of the mirror such that one of the first output and the second output is maximized.

6. The apparatus according to claim 4, wherein the illumination optical system further includes a plate provided in an optical path between the mirror and the diffraction optical element,
the adjusting mechanism further includes a third adjusting mechanism configured to adjust a tilting angle of the plate, and
the third adjusting mechanism adjusts the tilting angle such that one of the first output and the second output is maximized.

7. The apparatus according to claim 1, further comprising a turret where the first diaphragm and a second diaphragm having a larger opening diameter than the first diaphragm are formed,
wherein by driving the turret, the second diaphragm is inserted in the optical path near the predetermined plane, and the first diaphragm is retracted from the optical path near the predetermined plane.

8. The apparatus according to claim 7, wherein the turret further includes a diaphragm for modified illumination at the time of exposure.

9. The apparatus according to claim 1, wherein the illumination optical system further includes an optical integrator configured to illuminate the diffraction optical element.

10. An adjusting method of adjusting an illumination optical system that includes a diffraction optical element provided in an optical path between a light source and an original, a condensing optical system configured to condense a light beam that exited from the diffraction optical element, and a detector configured to detect a light beam that exited from the condensing optical system, the method comprising:
measuring a first output as an output of the detector by arranging a diaphragm set to an opening diameter where an output of the detector decreases when an incident angle of light from the light source on the diffraction optical element deviates from a target angle in the optical path near a predetermined plane where the light beam is condensed by the condensing optical system; and
measuring a second output as an output of the detector by retracting the diaphragm from the optical path near the predetermined plane,
wherein the incident angle is changed sequentially, the measuring the first output and the measuring the second output are repeated at each of the changed incident angles, and the incident angle is adjusted so as to set the incident angle to an angle at which a light amount ratio obtained as a ratio of the first output to the second output is maximized.

11. An article manufacturing method of manufacturing an article, the method comprising:
exposing a substrate by using an exposure apparatus; and
developing the substrate exposed in the exposing, wherein the article is manufactured from the developed substrate,
wherein the exposure apparatus comprises:
an illumination optical system configured to illuminate an original with light from a light source;
a projection optical system configured to project a pattern of the original on a substrate; and
a controller,
wherein the illumination optical system includes
a diffraction optical element provided in an optical path between the light source and the original,
a condensing optical system configured to condense a light beam that exited from the diffraction optical element,
a detector configured to detect a light beam that exited from the condensing optical system, and
a first diaphragm configured to be inserted in the optical path near a predetermined plane where the light beam is condensed by the condensing optical system,
an opening diameter of the first diaphragm is set such that an output of the detector decreases when an incident angle of the light from the light source on the diffraction optical element deviates from a target angle, and
based on a first output as an output of the detector when the first diaphragm is inserted in the optical path near the predetermined plane and a second output as an output of the detector when the first diaphragm is retracted from the optical path near the predetermined plane, the controller performs a process of adjusting the incident angle.

* * * * *